(12) United States Patent
Honda et al.

(10) Patent No.: US 7,942,158 B2
(45) Date of Patent: May 17, 2011

(54) ULTRASONIC EDGE WASHING APPARATUS

(75) Inventors: Yosuke Honda, Toyohashi (JP); Yuichi Asayama, Toyohashi (JP); Yuichi Maita, Toyohashi (JP); Tomomi Hikita, Toyohashi (JP); Yoshikazu Muramatsu, Toyohashi (JP); Ryoji Kondo, Toyohashi (JP); Haruo Yamamori, Toyohashi (JP); Naoyuki Fujiwara, Toyohashi (JP)

(73) Assignee: Honda Electronics Co., Ltd., Aichi-ken (JP)

( * ) Notice: Subject to any disclaimer, the term of this patent is extended or adjusted under 35 U.S.C. 154(b) by 1141 days.

(21) Appl. No.: 11/482,444

(22) Filed: Jul. 7, 2006

(65) Prior Publication Data

US 2007/0012343 A1   Jan. 18, 2007

(30) Foreign Application Priority Data

Jul. 13, 2005 (JP) ................................. 2005-204863
Nov. 30, 2005 (JP) ................................. 2005-347109

(51) Int. Cl.
*B08B 6/00* (2006.01)

(52) U.S. Cl. ............. 134/198; 134/104.2; 134/137; 134/172; 134/184

(58) Field of Classification Search ............. 134/104.2, 134/137, 172, 184, 198
See application file for complete search history.

(56) References Cited

U.S. PATENT DOCUMENTS

| | | | | |
|---|---|---|---|---|
| 4,834,124 A | * | 5/1989 | Honda | 134/184 |
| 5,729,856 A | * | 3/1998 | Jang et al. | 15/88.1 |
| 6,119,367 A | * | 9/2000 | Kamikawa et al. | 34/401 |
| 6,345,630 B2 | * | 2/2002 | Fishkin et al. | 134/1.3 |
| 6,523,553 B1 | * | 2/2003 | Redeker et al. | 134/61 |
| 2003/0098040 A1 | * | 5/2003 | Nam et al. | 134/1.3 |
| 2005/0087219 A1 | * | 4/2005 | Takahashi et al. | 134/184 |
| 2006/0291855 A1 | * | 12/2006 | Shigemori et al. | 396/611 |

* cited by examiner

*Primary Examiner* — Michael Barr
*Assistant Examiner* — Jason Heckert
(74) *Attorney, Agent, or Firm* — Richard M. Goldberg

(57) ABSTRACT

An edge of a material to be washed is held between forked portions of a vibration transmitting portion. An ultrasonic vibrator is attached to an enlarged portion of the vibration transmitting portion, and the ultrasonic waves supplied from the ultrasonic vibrator irradiate the washing liquid flowing to the forked portion, and the edge of the material to washed is washed by the ultrasonic wave and the washing liquid.

5 Claims, 7 Drawing Sheets

ULTRASONIC EDGE WASHING APPARATUS

BACKGROUND OF THE INVENTION

The present invention relates to an ultrasonic edge washing apparatus for washing an edge of a liquid crystal glass plate material to be washed.

In an ultrasonic washing apparatus according to the prior art, when washing liquid is supplied to a nozzle from a washing liquid supply pipe, and an ultrasonic oscillating output from an ultrasonic oscillator is supplied to an ultrasonic vibrator, the washing liquid from the nozzle is supplied on the material to be washed and the ultrasonic vibration supplied in the washing liquid is irradiated and washed to the material to be washed.

In another ultrasonic disk washing apparatus according to the prior art, an ultrasonic vibrator is attached to an under portion of an ultrasonic generating device and is electrically connected to a connector attached to the upper portion of the ultrasonic generating device. Oscillating outputs from an ultrasonic oscillator are supplied to the connector, and a material to be washed as a semiconductor wafer is held opposite to the ultrasonic vibrator in the ultrasonic generating device in a small gap. Nozzles for supplying washing liquid are provided at both sides of the ultrasonic generating device. The washing liquid supplied from the nozzles flows in the gap between the ultrasonic vibrator and the material to be washed and the material to be washed is washed by the ultrasonic vibration irradiated from the ultrasonic vibrator.

In the above ultrasonic washing apparatus, although the flat portion of the material to be washed is fully washed by the ultrasonic vibration generated by the ultrasonic vibrator, there is a problem that stain removed from the surface of the material to be washed flows with the washing liquid and is caught at the edge or at a notch of the material to be washed, and the stain at the edge of the material cannot be removed by concentrating the washing liquid to the edge of material.

SUMMARY OF THE INVENTION

It is, therefore, the primary object of the present invention to provide an ultrasonic edge washing apparatus in which ultrasonic waves are irradiated to an edge of a material to be washed from a forked portion at the point of a horn which is a vibration transmitting material and washing liquid flows to the edge of the material.

It is another object of the present invention to provide an ultrasonic edge washing apparatus in which ultrasonic waves are irradiated to an edge of material to be washed from a forked portion formed at a side of a horn which is a vibration transmitting material and washing liquid flows to the edge of the material.

In order to accomplish the above and other objects, the present invention comprises an enlarged end for attaching an ultrasonic vibrator, a vibration transmitting portion lengthened from the enlarged end, a forked portion formed near the other end of the vibration transmitting potion, a material to be washed and rotated supported opposite to the forked portion in a slight gap, and a washing liquid supply device for supplying a washing liquid to a surface of the material to be washed. The washing liquid is supplied near the edge of the material to be washed. The ultrasonic waves supplied from the ultrasonic vibrator irradiate the washing liquid flowing to the forked portion, and the edge of the material to washed is washed by the ultrasonic wave and the washing liquid.

DESCRIPTION OF THE PREFERRED EMBODIMENT

Figure 1:
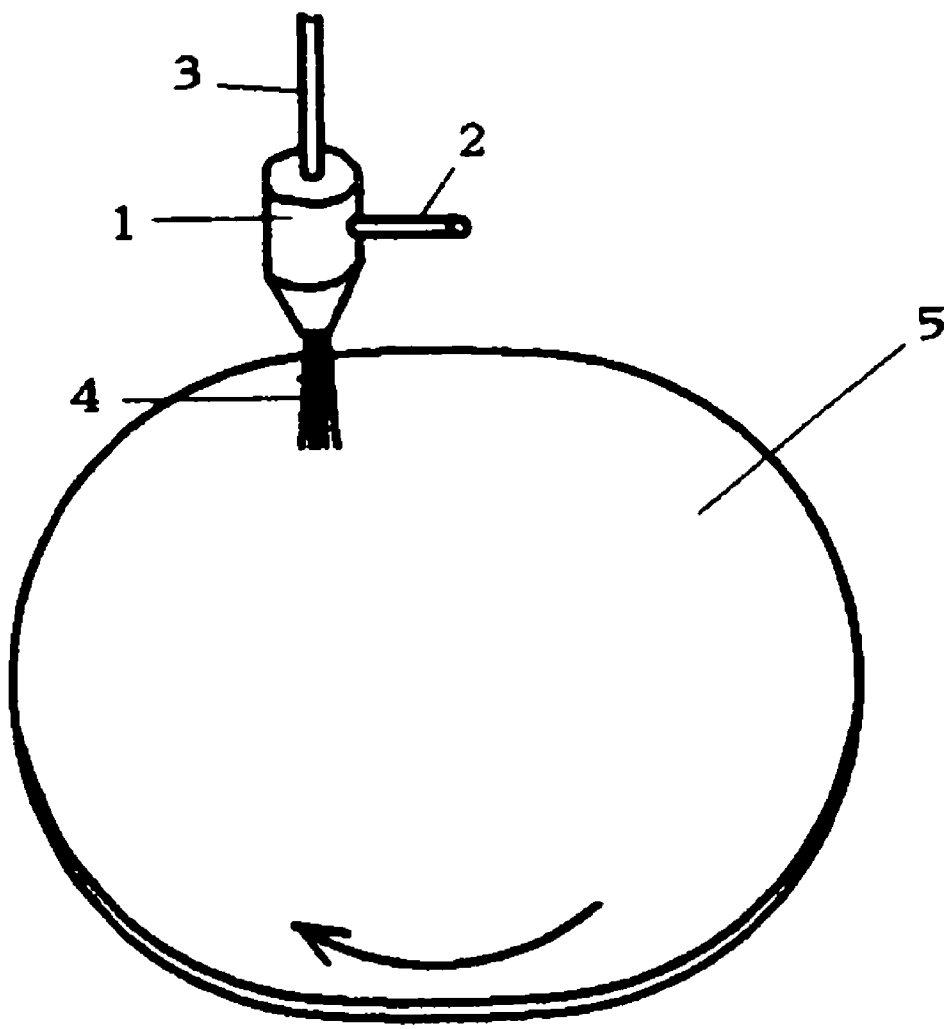
FIG. 1 shows a perspective view of a prior ultrasonic washing apparatus.

In a prior ultrasonic washing apparatus, as shown in FIG. 1, washing liquid is supplied to a nozzle 1 from a washing liquid supplying pipe 2, and oscillating outputs are supplied to an ultrasonic vibrator (not shown) in the nozzle 1 through lead lines 3 from an ultrasonic oscillator. As a result, washing liquid 4 is supplied on a material 5 to be washed as a semiconductor from the nozzle and the surface of the material 5 is washed by the liquid 4 on which the ultrasonic wave is applied.

Figure 2:
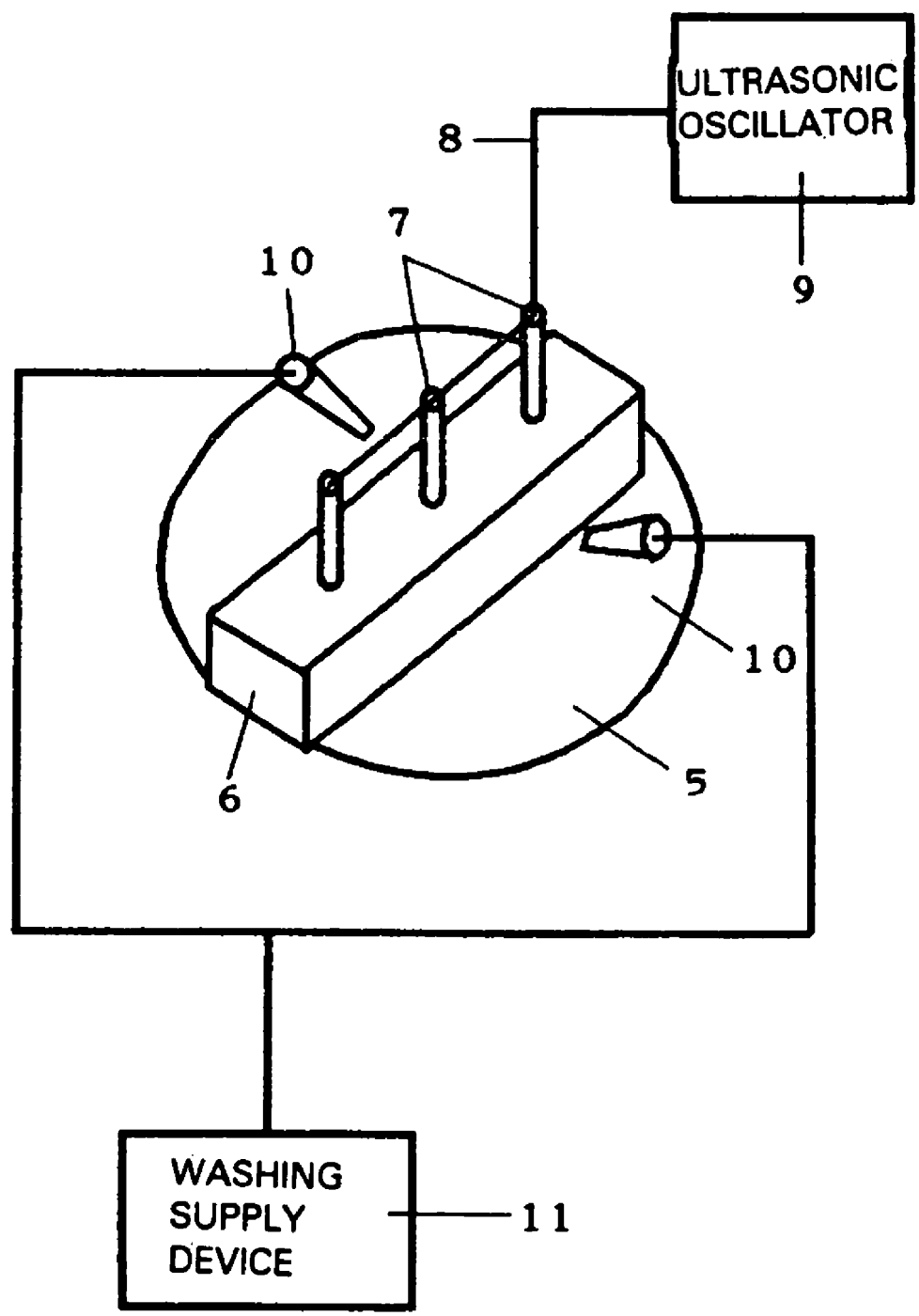
FIG. 2 shows a perspective view of the prior ultrasonic washing apparatus in FIG. 1.

In the ultrasonic washing apparatus in the prior art, as shown in FIG. 2, an ultrasonic vibrator (not shown) is attached to an under surface of ultrasonic generating device 6 and is electrically connected to a connector 7. Oscillating outputs from an ultrasonic oscillator 9 are supplied through cables 8 to the connector 7. A material 5 to be washed as a semiconductor wafer is held in a small gap opposite the ultrasonic vibrator of the ultrasonic generating device 6. Nozzles 10 to which the washing liquid is supplied from a washing supply device 11, are attached at both sides of the ultrasonic generating device 6. The washing liquid flows into the gap of the ultrasonic vibrator and the material to be washed, and the surface of the material 5 to be washed is washed by the ultrasonic wave irradiated from the ultrasonic vibrator.

In the above ultrasonic washing apparatus, although the flat surface of the material to be washed is fully washed by the ultrasonic waves, stain removed from the surface of the material 5 flows with the washing liquid and is caught at the edge or at a notch of the material to be washed. The stain at the edge of the material cannot be removed by concentrating the washing liquid to the edge of material.

Figure 3:
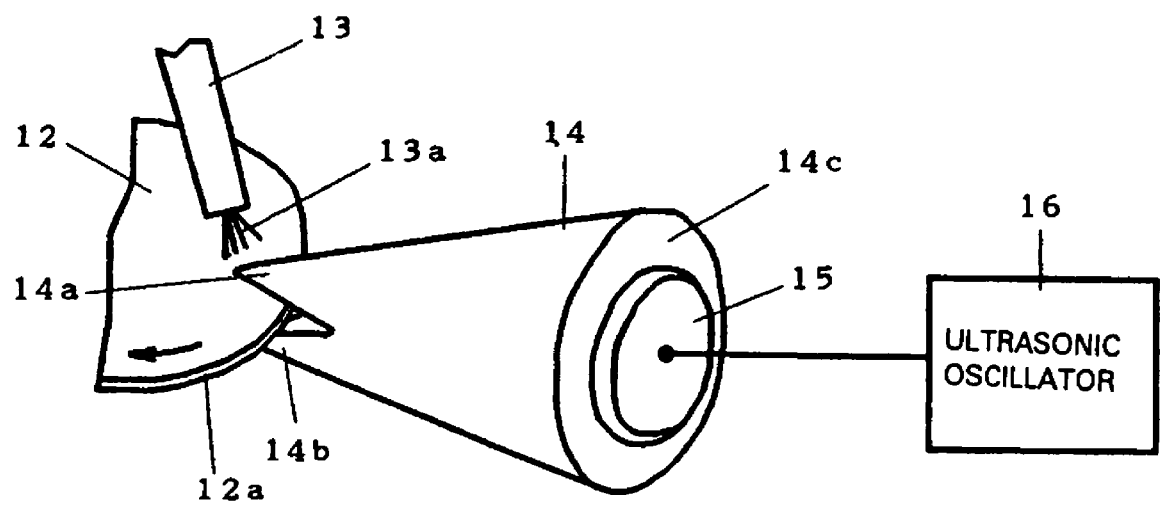
FIG. 3 shows a perspective view of an ultrasonic edge washing apparatus according to an embodiment of the present invention.
Figure 4:
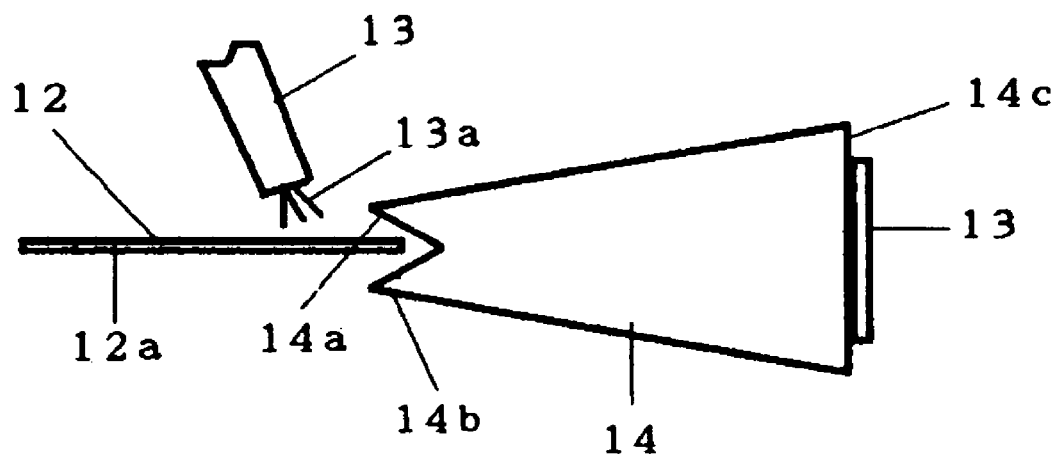
FIG. 4 shows a side view of the ultrasonic edge washing apparatus in FIG. 3.

Referring to FIGS. 3 and 4, a material 12 to be washed as a semiconductor is supported to be rotated. A washing liquid supply device 13 is mounted near an edge 12a of the material to be washed. Forked portions 14a and 14b are cut and formed by an acute angle (less than 90 degrees) in a point of a horn 14 conically formed as a vibration transmitting portion. The edge of the material to be washed is inserted between the forked portions 14a and 14b with a small gap. An enlarged portion is formed at the other end of the horn 14. An ultrasonic vibrator 15 is attached to the enlarged portion 14c of the horn 14, and oscillating outputs from an ultrasonic oscillator 16 are applied to the ultrasonic vibrator 15.

In the above ultrasonic edge washing apparatus, the washing liquid 13a from the washing liquid supply device 13 flows between the edge 12a of the material 12 to be washed and the forked portions 14a and 14b. Ultrasonic waves are transmitted to be concentrated from the forked portions 14a and 14b to the edge 12a of the horn 14 by driving ultrasonic oscillator 16 and are transmitted through the washing liquid held between the forked portions 14a and 14b by a centrifugal force depending on the rotation of the material to be washed. Thereby, the edge 12a and any notch portion in edge 12a of the material 12 are washed by the washing liquid and the ultrasonic wave. The stain removed by the washing liquid flies by centrifugal force depending on the rotation of the material 12, and falls with the washing liquid after the washing liquid flows under the forked portions 14a and 14b.

As stated above, in the ultrasonic edge washing apparatus, the edge 12a of the material 12 is inserted between the forked portions 14a and 14b opposite to the edge 12 in a small gap, and the stain added to the edge 12a of the material 12 is immediately and effectively removed from the edge 12a.

Figure 5:
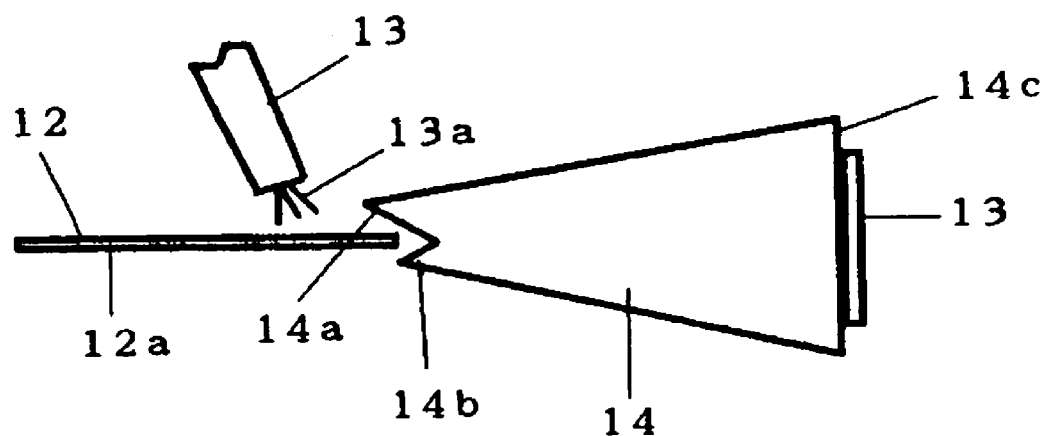
FIG. 5 shows a side view of an ultrasonic edge washing apparatus according to another embodiment of the present invention.

Referring to FIG. 5, 12 designates a material to be washed; 13, a washing liquid supply device; and 14, a conical horn. Since these constructions are the same as the those in the above embodiment, an explanation of these is omitted. In the present embodiment, the point of the lower portion 14b of the forked portions 14a and 14b is made shorter than the portion 14a.

In this embodiment constructed as above, the washing liquid easily flows from the edge 12a of the material 12 to be washed after washing.

In the above embodiment, the horn is conical, but may be a quadrangular pyramid, and though the forked portions are constructed by an acute angle, the forked portions may be a circular arc.

Figure 6:
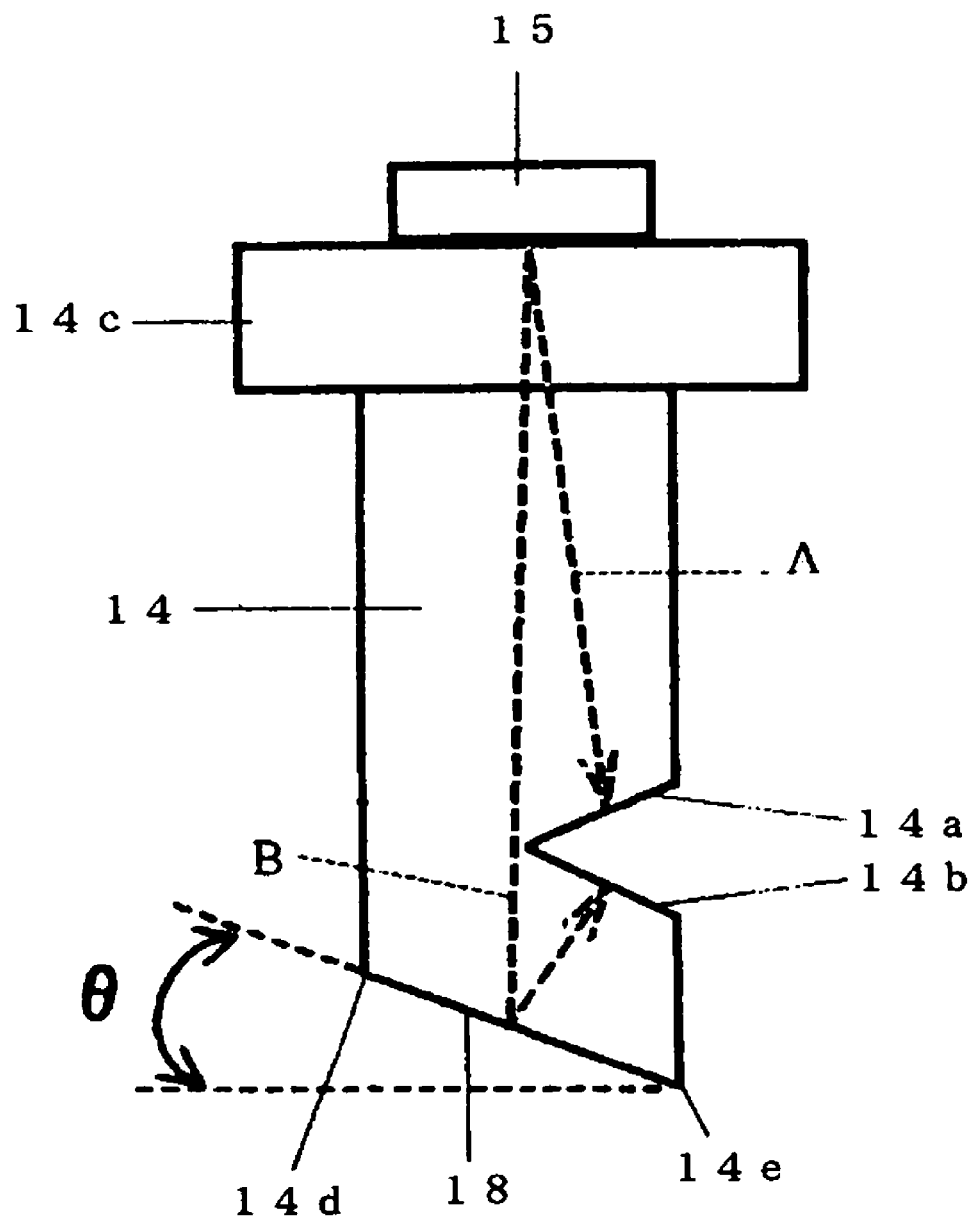
FIG. 6 shows a side view of an ultrasonic edge washing apparatus according to still another embodiment of the present invention.

Referring to FIG. 6, an attaching portion for fixing an ultrasonic vibrator 15 is formed at one end of a vibration transmitting portion 14. An inclined portion 18 is formed between one side portion 14d and the other side portion 14e in an angular range of 0 degree to 45 degrees relative to one flat end 14c of the vibration transmitting portion 14 at the other end of the vibration transmitting portion 14. Forked portions 14a and 14b are formed between the one side portion 14e of the inclined portion 18 and one flat end 14c of the vibration transmitting portion 14. The ultrasonic waves from the ultrasonic vibrator 15 are irradiated from the upper portion 14a to a position between the forked portions 14a and 14b, and the ultrasonic waves which pass the side of the forked portion are reflected by the inclined portion 18 and are irradiated between the forked portions 14a and 14b from the lower portion 14b of the forked portions 14a and 14b. The inclined portion 18 is so set that the ultrasonic waves reflected by the inclined portion 18 are transmitted to the lower portion 14b of the forked portions 14a and 14b.

Figure 7:
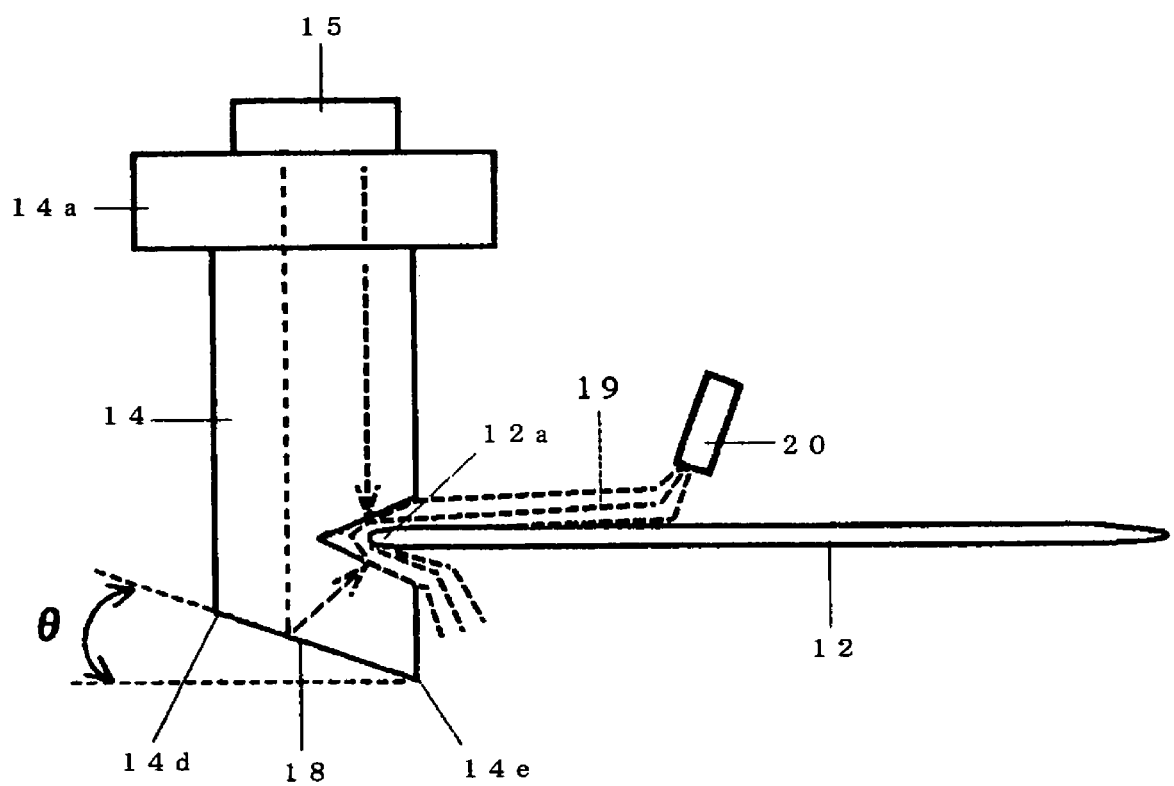
FIG. 7 shows a side view of the ultrasonic edge washing apparatus in FIG. 6.

In the ultrasonic edge washing apparatus constructed above in the embodiment of the present invention, as shown in FIG. 7, the edge 12a of the material 12 to be washed is mounted between the forked portions 14a and 14b in a small gap, and the washing liquid 19 from the washing liquid supply device 20 flows between the edge 12a of the material 12 to be washed and the forked portions 14a and 14b. When oscillating outputs are applied to the ultrasonic vibrator 15, an ultrasonic wave A is transmitted from the ultrasonic vibrator 15 to the upper portion 14a of the forked portions 14a and 14b and is irradiated between the forked portions 14a and 14b from the upper portion 14. An ultrasonic wave B from the ultrasonic vibrator 15 is reflected by the inclined portion 18 and is transmitted to the lower portion 14b of the forked portions 14a and 14b. Thereby, the edge 12a of the material 12 to be washed is washed by ultrasonic waves A and B and the washing liquid 19, and the stain removed with the washing liquid 19 is passed through the forked portions 14a and 14b and leaves the material 12 to be washed.

In the above embodiment, the forked portions 14a and 14b are formed at the side of the vibration transmitting portion 14, the edge 12a of the material 12 to be washed is inserted between forked portions 14a and 14b in a small gap, and the stain adhered to the edge 12a of the material 12 is effectively and immediately removed by the ultrasonic waves generated and the washing liquid 19 from the washing liquid supply device.

The vibration transmitting portion 14 is formed by quartz.

What is claimed is:

1. An ultrasonic edge washing apparatus comprising:
   an enlarged end for attaching an ultrasonic vibrator,
   a vibration transmitting portion having:
      a slender elongated portion connected to the enlarged end,
      a tapered tip at one end of the slender elongated portion for transmitting a vibration emitted from the ultrasonic vibrator connected to the enlarged end,
      a forked portion having two tips cut by an acute angle and formed at the tapered tip of the vibration transmitting portion, said forked portion having a small gap between the two tips, with the small gap arranged for receiving an edge of a material to be washed and rotated at a center of the two tips and with the two tips arranged on the vibration transmitting portion such that strong ultrasonic waves are provided at the center of the two tips and, in operation of the apparatus, the edge is positioned to receive ultrasonic waves transmitted to the edge of a material to be washed, and
   a washing liquid supply device for supplying a washing liquid to a surface of the material to be washed near the edge thereof at said forked portion, such that the ultrasonic waves supplied from an ultrasonic vibrator irradiate the washing liquid flowing to the forked portion and the edge of the material to be washed is washed by the ultrasonic waves and the washing liquid.

2. An ultrasonic edge washing apparatus as set forth claim 1, wherein the vibration transmitting portion is made from quartz.

3. An ultrasonic edge washing apparatus comprising:
   an enlarged end for attaching an ultrasonic vibrator,
   a vibration transmitting portion having:
      a cylindrical portion connected to the enlarged end for transmitting a vibration emitted from the ultrasonic vibrator,
      an inclined portion formed at an end of the cylindrical portion
      a forked portion having two tips cut by an acute angle and formed at a side face of the cylindrical portion of the vibration transmitting portion, said forked portion having a small gap between the two tips, with the small gap arranged for receiving substantially only an edge of a material to be washed and rotated at a center of the two tips and with the single forked portion being arranged in combination with said vibration transmitting portion to supply ultrasonic waves from the vibration transmitting portion substantially only to the edge received in said small gap such that strong ultrasonic waves are provided at the center of the two tips and with the two tips arranged on the vibration transmitting portion such that strong ultrasonic waves are provided at the center of the two tips and, in operation of the apparatus, the edge is positioned to receive ultrasonic waves transmitted to the edge of a material to be washed, and a washing liquid supply device for supplying a washing liquid to a surface of the material to be washed near the edge thereof at said forked portion, such that the ultrasonic waves supplied from an ultrasonic vibrator irradiate the washing liquid flowing to the forked portion and the edge of the material to be washed is washed by the ultrasonic waves and the washing liquid.

4. An ultrasonic edge washing apparatus as set forth claim 3, wherein the vibration transmitting portion is made from quartz.

5. An ultrasonic edge washing apparatus as set forth claim 3, wherein the inclined portion is formed in an angular range between 0 degrees and 45 degrees relative to one flat end of the vibration transmitting portion.

\* \* \* \* \*